(12) United States Patent
Chen et al.

(10) Patent No.: US 7,863,852 B2
(45) Date of Patent: Jan. 4, 2011

(54) MOTOR AND CONTROL CIRCUIT THEREOF

(75) Inventors: Lee Long Chen, Taoyuan Hsien (TW); Chi-Chen Shen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 341 days.

(21) Appl. No.: 12/029,351

(22) Filed: Feb. 11, 2008

(65) Prior Publication Data
US 2008/0258584 A1    Oct. 23, 2008

(30) Foreign Application Priority Data
Apr. 17, 2007    (TW) .............................. 96113437 A

(51) Int. Cl.
*H02P 3/18*    (2006.01)
(52) U.S. Cl. ...................... 318/716; 318/717; 318/718; 318/719; 318/720; 310/68 B
(58) Field of Classification Search ................ 318/716, 318/717, 718, 719, 720; 388/803; 310/68 B
See application file for complete search history.

(56) References Cited

U.S. PATENT DOCUMENTS

| | | | | |
|---|---|---|---|---|
| 3,743,902 A | * | 7/1973 | Perkins et al. | 318/400.06 |
| 5,821,660 A | * | 10/1998 | Anderson | 310/184 |
| 6,271,638 B1 | * | 8/2001 | Erdman et al. | 318/400.01 |
| 6,791,226 B1 | * | 9/2004 | Dhawan | 310/184 |
| 7,304,446 B2 | * | 12/2007 | Wang et al. | 318/254.1 |
| 7,459,876 B2 | * | 12/2008 | Chiu et al. | 318/702 |

\* cited by examiner

*Primary Examiner*—Bentsu Ro
*Assistant Examiner*—David S Luo
(74) *Attorney, Agent, or Firm*—Birch, Stewart, Kolasch & Birch, LLP

(57) ABSTRACT

A control circuit of a motor includes at least two sensor chips and at least two winding sets. The sensor chips are electrically connected to each other, and each of the winding sets has a first winding and a second winding. The first end of the first windings and the first end of the second windings are electrically connected to each other, and the second end of the first windings and the second end of the second windings are electrically connected to the sensor chips correspondingly. In addition, a motor having the control circuit is also disclosed.

20 Claims, 6 Drawing Sheets

(REPLACEMENT SHEET)

MOTOR AND CONTROL CIRCUIT THEREOF

CROSS REFERENCE TO RELATED APPLICATIONS

This Non-provisional application claims priority under 35 U.S.C. §119(a) on Patent Application Ser. No(s). 096113437, filed in Taiwan, Republic of China on Apr. 17, 2007, the entire contents of which are hereby incorporated by reference.

BACKGROUND OF THE INVENTION

1. Field of Invention

The present invention relates to a motor and a control circuit thereof and in particular to a motor controlled by multiple sensor chips and a control circuit thereof.

2. Related Art

FIG. 1 is a schematic illustration showing a conventional motor 1. Referring to FIG. 1, the motor 1 has a rotor 11 and a stator 12. The rotor 11 has many magnetic poles including two N poles and two S poles arranged alternately. The stator 12 is composed of a plurality of silicon steel sheets stacked together, and the stator 12 has a plurality of winding sensing arms disposed opposite to the magnetic poles.

FIG. 2 is a schematic illustration showing a control circuit 13 of the motor 1 of FIG. 1. Referring to FIG. 2, the control circuit 13 includes a sensor chip 131 and a winding set 132. The sensor chip 131 of the control circuit 13 has a positive power input terminal $V_+$ and a negative power input terminal $V_-$, the positive power input terminal $V_+$ is electrically connected to a positive power $V_{CC}$, and the negative power input terminal $V_-$ is electrically connected to a ground $V_{ground}$. In addition, the sensor chip 131 has two output ports A and B. The winding set 132 has a first winding $L_1$ and a second winding $L_2$, which are respectively electrically connected to the output ports A and B.

The sensor chip 131 senses magnetic properties of the magnetic poles of the rotor to change the directions of the currents flowing through the first winding $L_1$ and the second winding $L_2$ to make the winding sensing arms generate magnetic forces to push the rotor 11 to rotate.

As mentioned above, one control circuit for controlling the conventional motor only has a sensor chip. Thus, one sensor chip needs to control the winding sets of the whole motor to provide the currents for the windings. Because the typical sensor chip cannot withstand the extra high current, this control circuit cannot be applied to the motor having high rotating speed, or the large size motor. Thus, the sensor chip for controlling the motor having the high rotating speed, or the large size motor must have the higher current withstanding ability, and this sensor chip usually has the higher cost.

SUMMARY OF THE INVENTION

In view of the foregoing, the present invention is to provide a motor to have a high current withstanding ability and a control circuit thereof.

To achieve the above, the present invention discloses a control circuit of a motor. The control circuit includes at least two sensor chips and at least two winding sets. Each of the winding sets has a first winding and a second winding. A first end of the first winding and a first end of the second winding of each winding set are electrically connected to each other, and a second end of the first winding and the second winding of each winding set are electrically connected to the sensor chips correspondingly.

To achieve the above, the present invention also discloses a motor including a rotor, a stator and a control circuit. The rotor has a plurality of magnetic poles. The stator is composed of a plurality of silicon steel sheets stacked together and has at least two sensing arms corresponding to the magnetic poles. The control circuit includes at least two sensor chips electrically connected to each other, and at least two winding sets. Each of the winding sets has a first winding and a second winding. A first end of the first winding and a first end of the second winding of each winding set are electrically connected to each other, and a second end of the first winding and a second end of the second windings of each winding set are electrically connected to the sensor chips correspondingly. The first windings and the second windings are respectively wound around the sensing arms of the silicon steel sheets As mentioned above, the motor and control circuit of the present invention have the following features. The number of the sensor chips in the control circuit is increased so that one sensor chip only controls a part of the winding sets. Thus, each sensor chip only has to withstand the current of the part of the winding sets so that the current withstanding ability of the sensor chip can be reduced. According to the combinations of several sensor chips, the sensor chip with the low current withstanding ability can also be adapted to the motor having the high rotating speed, or to the large size motor. In addition, since the control circuit has multiple sensor chips, when one of the sensor chips fails, the other sensor chip can serve as a backup chip to keep the motor operating.

BRIEF DESCRIPTION OF THE DRAWINGS

The present invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
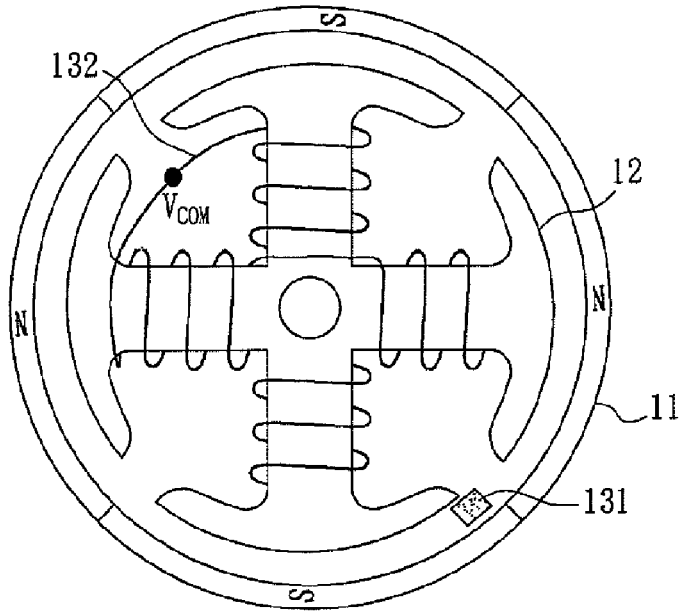
FIG. 1 is a schematic illustration showing a conventional motor.
Figure 2:
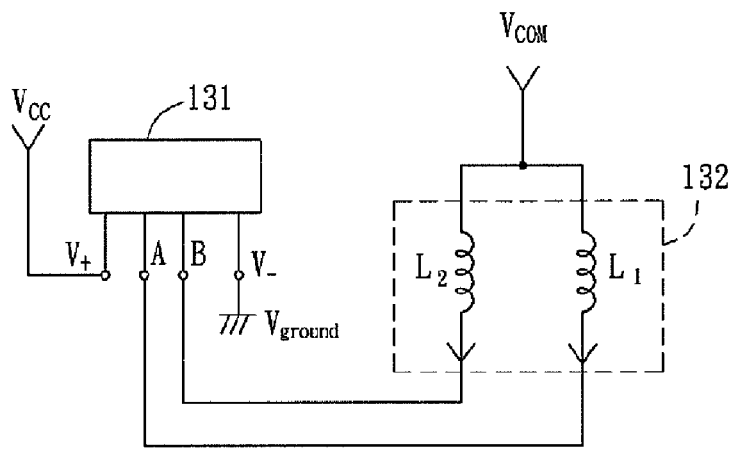
FIG. 2 is a schematic illustration showing a control circuit of the motor of FIG. 1.
Figure 3:
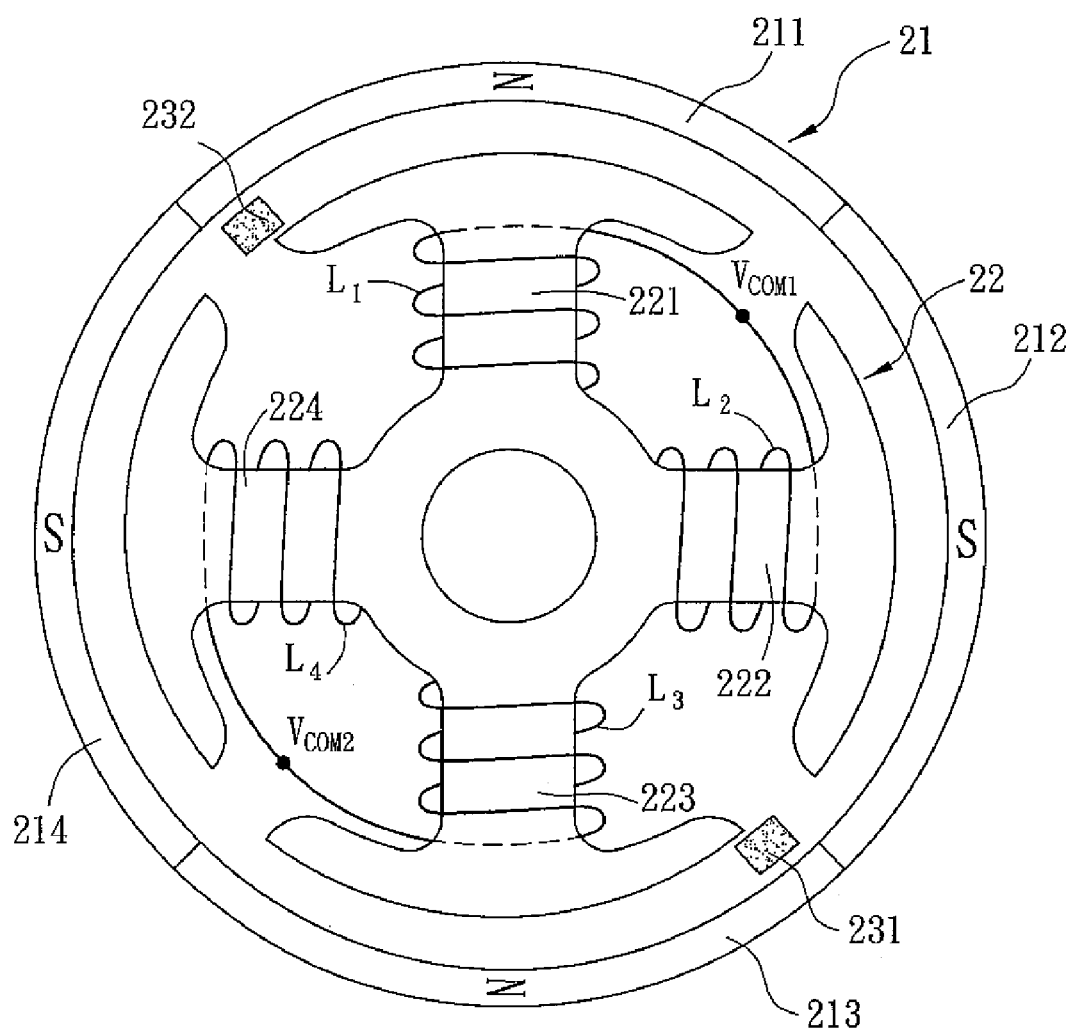
FIG. 3 is a schematic illustration showing a motor according to an embodiment of the present invention.
Figure 4:
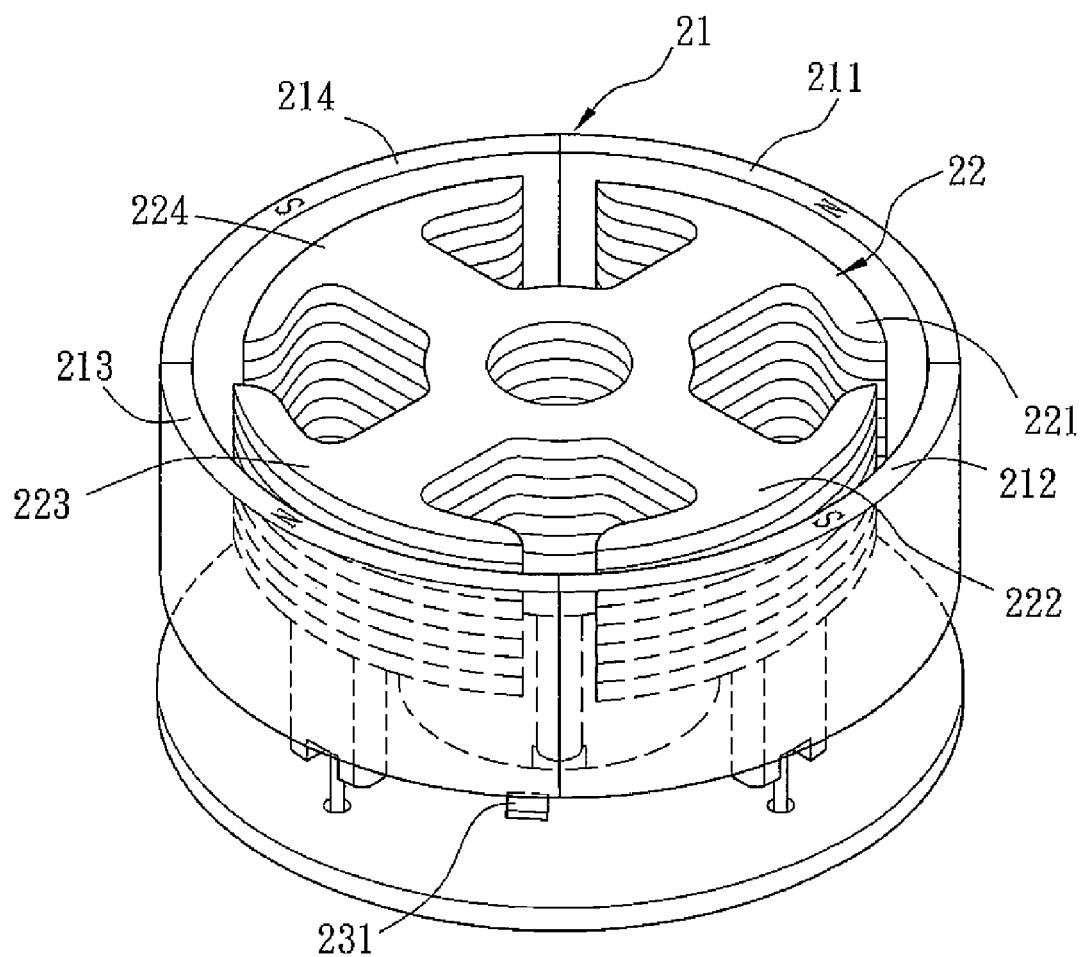
FIG. 4 is a three-dimensional diagram showing the motor of FIG. 3.

FIG. 3 is a schematic illustration showing a motor 2 according to an embodiment of the present invention. FIG. 4 is a three-dimensional diagram showing the motor 2 of FIG. 3. Referring to FIGS. 3 and 4, the motor 2 includes a rotor 21, a stator 22 and a control circuit 23.

The rotor 21 has a plurality of magnetic poles including N poles and S poles arranged alternately. In this embodiment, the rotor 21 has four magnetic poles 211, 212, 213 and 214, wherein the poles 211 and 213 are the N poles and the poles 212 and 214 are the S poles.

The stator 22 is composed of a plurality of silicon steel sheets stacked together. Herein, each silicon steel sheet has at least two sensing arms, and the sensing arms of the silicon steel sheets are respectively disposed opposite and correspond to the magnetic poles. For example, if the number of the magnetic poles of the rotor is equal to 2, 4, 6, 8, 10, . . . , the number of the sensing arms of the stator is also correspondingly equal to 2, 4, 6, 8, 10, . . . . In this embodiment, each of the silicon steel sheets of the stator 22 also corresponds to the corresponding magnetic pole of the rotor 21 and thus has four sensing arms 221, 222, 223 and 224.

Figure 5:
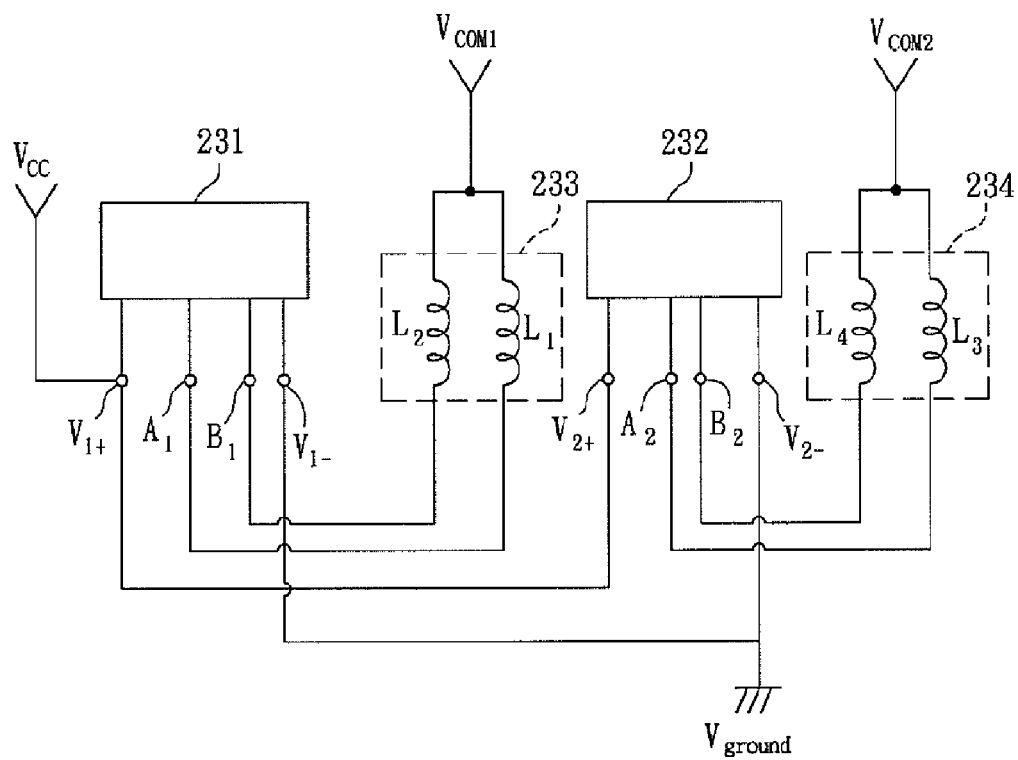
FIG. 5 is a schematic illustration showing the control circuit of the motor of FIG. 3.

As shown in FIG. 5, the control circuit 23 includes a first sensor chip 231, a second sensor chip 232, a first winding set 233 and a second winding set 234. The first sensor chip 231 has a positive power input terminal $V_{1+}$, the second sensor chip 232 has a positive power input terminal $V_{2+}$, and the positive power input terminals $V_{1+}$ and $V_{2+}$ are electrically connected to a positive power $V_{CC}$. In addition, the first sensor chip 231 has two output ports $A_1$ and $B_1$, and the second sensor chip 232 has two output ports $A_2$ and $B_2$.

In addition, the first sensor chip 231 and the second sensor chip 232 further respectively have a negative power input terminal $V_{1-}$ and a negative power input terminal $V_{2-}$ in this embodiment, and the negative power input terminals $V_{1-}$ and $V_{2-}$ are electrically connected to a ground $V_{ground}$. In this embodiment, each of the sensor chips is a Hall integrated circuit (Hall IC). In addition, each of the sensor chips 231 and 232 can be, for example but not limited to, the Hall IC having three pins according to different demands.

Furthermore, the first winding set 233 has a first winding $L_1$ and a second winding $L_2$, and the second winding set 234 has a third wire $L_3$ and a fourth wire $L_4$. The first end of the first winding $L_1$ and the first end of the second winding $L_2$ are electrically connected to a common end $V_{COM1}$, and the second end of the first winding $L_1$ and the second end of the second winding $L_2$ are respectively electrically connected to the output ports $A_1$ and $B_1$. Similarly, the first end of the third wire $L_3$ and the first end of the fourth wire $L_4$ are electrically connected to a common end $V_{COM2}$, and the second end of the third wire $L_3$ and the second end of the fourth wire $L_4$ are respectively electrically connected to the output ports $A_2$ and $B_2$.

The operations of the motor 2 will be described with reference to FIGS. 3 and 5 so as to make the effects and technological features of the present invention more apparent.

In the motor 2, the directions of currents flowing through the winding sets 233 and 234 make the sensing arms 221, 222, 223 and 224 generate magnetic forces to push the rotor 21 to rotate. The sensor chips 231 and 232 respectively control the directions of the currents flowing through the winding sets 233 and 234, and the sensor chips 231 and 232 simultaneously sense the magnetic properties of the magnetic poles 211, 212, 213 and 214 of the rotor 21 to determine to turn on the output ports $A_1$ or $B_1$, $A_2$ or $B_2$ or not. According to this action, the directions of the currents flowing through the winding sets 233 and 234 are changed, and the magnetic properties of the sensing arms 221, 222, 223 and 224 are thus changed.

In addition, the control circuit 23 of the motor 2 has the two sensor chips 231 and 232. Thus, if one of the sensor chips fails, the other sensor chip can serve as a backup chip to keep the motor 2 continuously operating.

Figure 6:
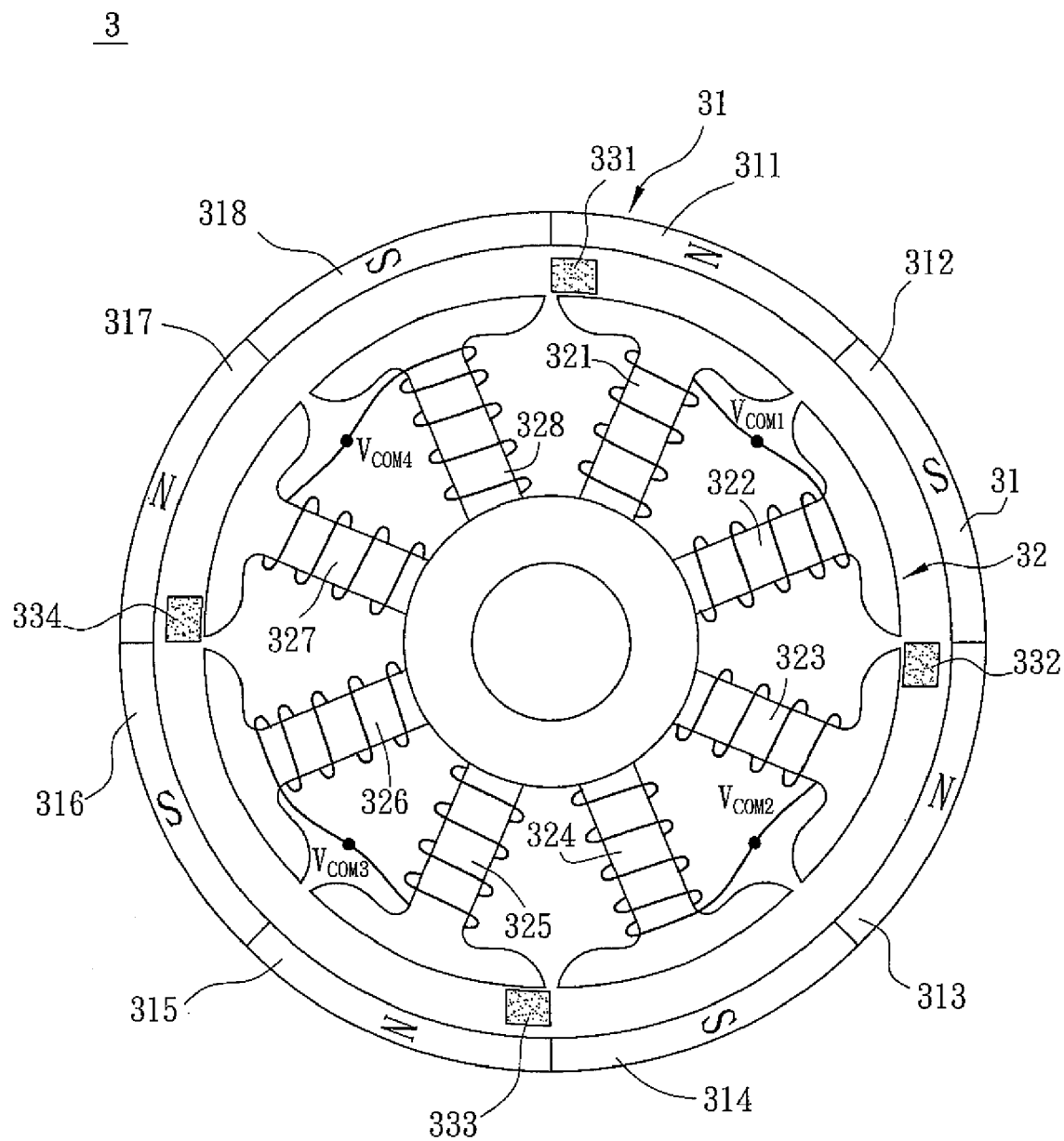
FIG. 6 is a schematic illustration showing a motor according to another embodiment of the present invention.
Figure 7:
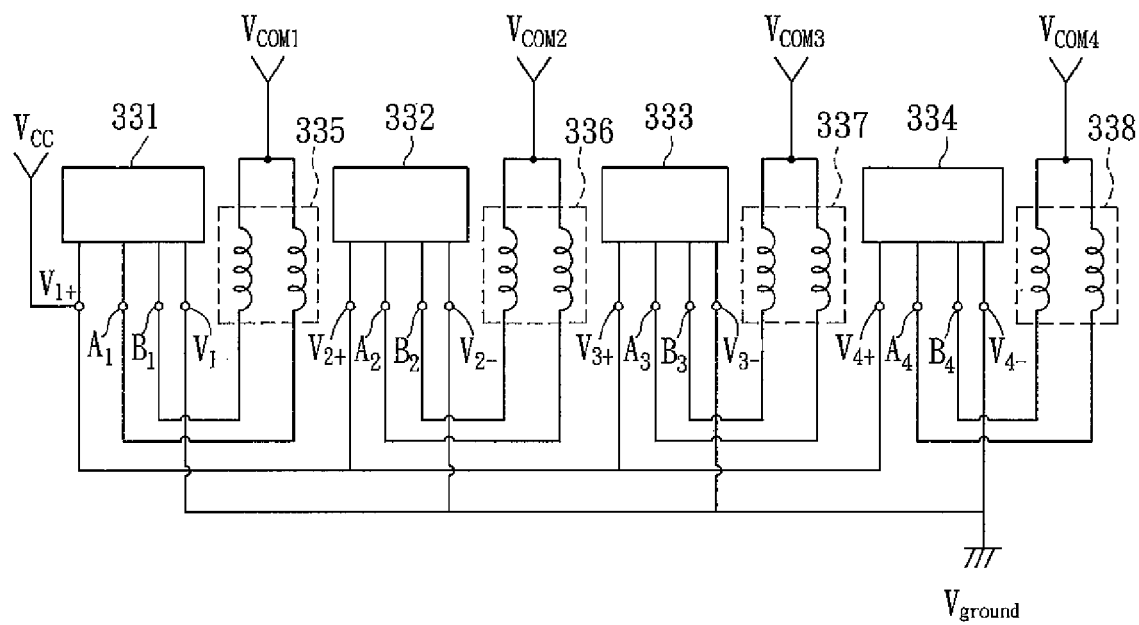
FIG. 7 is a schematic illustration showing the control circuit of the motor of FIG. 6.

Referring to FIGS. 6 and 7, a motor 3 according to another embodiment of the present invention includes a rotor 31, a stator 32 and a control circuit 33. The rotor 31 has a plurality of magnetic poles. The stator 32 is composed of a plurality of silicon steel sheets stacked together, and each silicon steel sheet has at least two sensing arms. The sensing arms of the silicon steel sheets are respectively disposed opposite and correspond to the magnetic poles. In this embodiment, the rotor 31 has eight magnetic poles 311, 312, 313, 314, 315, 316, 317 and 318, and the stator 32 also has eight sensing arms 321, 322, 323, 324, 325, 326, 327 and 328 in correspondence with the rotor 31. The magnetic poles 311, 313, 315 and 317 are N poles, the poles 312, 314, 316, and 318 are S poles, and the N and S poles are arranged alternately.

Referring again to FIG. 7, the control circuit 33 includes four sensor chips 331, 332, 333 and 334 and four winding sets 335, 336, 337 and 338. The sensor chips 331, 332, 333 and 334 respectively have positive power input terminals $V_{1+}$, $V_{2+}$, $V_{3+}$, and $V_{4+}$ and negative power input terminal $V_{1-}$, $V_{2-}$, $V_{3-}$ and $V_{4-}$, and further have several output ports $A_1$, $A_2$, $A_3$, $A_4$, $B_1$, $B_2$, $B_3$ and $B_4$. Each of the winding sets 335, 336, 337 and 338 has a first winding and a second winding, and the first end of the first windings and the first end of the second windings are respectively electrically connected to common ends $V_{COM1}$, $V_{COM2}$, $V_{COM3}$ and $V_{COM4}$. In addition, the second end of the first windings and the second end of the second windings are electrically connected to the corresponding output ports.

The effects and technological features of the motor 3 and the control circuit 33 thereof are similar as those of the motor 2 and the control circuit 23, so detailed descriptions thereof will be omitted. It is to be noted that the motor 3 controls four winding sets by using four sensor chips, and the motor 2 controls two winding sets by using two sensor chips. Consequently, the motor which can afford high current can be controlled by using more than two sensor chips in conjunction with the corresponding winding sets. In addition, the motor of the present invention is not restricted to the motor including two sensor chips for correspondingly controlling two winding sets. Also, two sensor chips can correspondingly control 4, 6, 8, 10, . . . winding sets according to the different circuit designs.

In summary, the motor and control circuit of the present invention have the following features. The number of the sensor chips in the control circuit is increased so that one sensor chip only controls a part of the winding sets. Thus, each sensor chip only has to withstand the current of the part of the winding sets so that the current withstanding ability of the sensor chip can be reduced. According to the combinations of several sensor chips, the sensor chip with the low current withstanding ability can also be adapted to the motor having the high rotating speed, or to a large size motor. In addition, when one of the sensor chips fails, the other sensor chip can serve as a backup chip to keep the motor operating because the control circuit has multiple sensor chips.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A control circuit of a motor, comprising:
    at least two sensor chips; and
    at least two winding sets, wherein each of the winding sets comprises a first winding and a second winding, the first winding and the second winding respectively correspond to two magnetic poles of a rotor of the motor, a first end of the first winding and a first end of the second winding of each of the winding sets are electrically connected to each other, and a second end of the first winding and a second end of the second winding of each of the winding sets are electrically connected to the sensor chips correspondingly.

2. The control circuit according to claim 1, wherein the sensor chips are electrically connected to each other.

3. The control circuit according to claim 1, wherein each of the sensor chips comprises a positive power input terminal, and the positive power input terminals are electrically connected to each other.

4. The control circuit according to claim 1, wherein each of the sensor chips has a negative power input terminal, and the negative power input terminals are electrically connected to each other.

5. The control circuit according to claim 4, wherein the negative power input terminals are connected to ground.

6. The control circuit according to claim 1, wherein each of the sensor chips is a Hall integrated circuit (Hall IC).

7. The control circuit according to claim 1, wherein when one of the sensor chips fails, the other one of the sensor chips serves as a backup sensor chip to keep the motor rotating.

8. The control circuit according to claim 1, wherein when the number of the sensor chips is equal to N, the number of the winding sets is equal to 2N, and N is a natural number greater than or equal to 2.

9. A motor, comprising:
a rotor comprising a plurality of magnetic poles;
a stator comprising at least two sensing arms corresponding to the magnetic poles; and
a control circuit comprising at least two sensor chips and at least two winding sets, wherein each of the winding sets has a first winding and a second winding, the first winding and the second winding respectively correspond to two magnetic poles of the rotor, the first windings and the second windings are respectively wound around the sensing arms, a first end of the first winding and a first end of the second winding of each of the winding sets are electrically connected to each other, and a second end of the first winding and a second end of the second winding of each of the winding sets are electrically connected to the sensor chips correspondingly.

10. The motor according to claim 9, wherein the magnetic poles have a plurality of N poles and a plurality of S poles, and the N poles and the S poles are disposed alternately.

11. The motor according to claim 9, wherein the sensor chips are electrically connected to each other.

12. The motor according to claim 9, wherein each of the sensor chips has a positive power input terminal, and the positive power input terminals are electrically connected to each other.

13. The motor according to claim 9, wherein each of the sensor chips comprises a negative power input terminal, and the negative power input terminals are electrically connected to each other.

14. The motor according to claim 13, wherein the negative power input terminals are connected to ground.

15. The motor according to claim 9, wherein each of the sensor chips is a Hall integrated circuit (Hall IC).

16. The motor according to claim 9, wherein the number of the magnetic poles and the number of the sensing arms are even numbers.

17. The motor according to claim 9, wherein when one of the sensor chips fails, the other one of the sensor chips serves as a backup sensor chip to keep the motor rotating.

18. The motor according to claim 9, wherein when the number of the sensor chips is equal to N, the number of the winding sets is equal to 2N, and N is a natural number greater than or equal to 2.

19. A control circuit of a motor, comprising:
at least two sensor chips; and
at least two winding sets, wherein each of the winding sets comprises a first winding and a second winding, a first end of the first winding and a first end of the second winding of each of the winding sets are electrically connected to each other, and a second end of the first winding and a second end of the second winding of each of the winding sets are electrically connected to the sensor chips correspondingly, one of the sensor chip only controls a part of the winding sets such that each sensor chip only withstands the current of the part of the winding sets so that the current withstanding ability of the sensor chip can be reduced.

20. A motor, comprising:
a rotor comprising a plurality of magnetic poles;
a stator comprising at least two sensing arms corresponding to the magnetic poles; and
a control circuit comprising at least two sensor chips and at least two winding sets, wherein each of the winding sets has a first winding and a second winding, the first windings and the second windings are respectively wound around the sensing arms, a first end of the first winding and a first end of the second winding of each of the winding sets are electrically connected to each other, and a second end of the first winding and a second end of the second winding of each of the winding sets are electrically connected to the sensor chips correspondingly, when one of the sensor chips fails, the other sensor chip can serve as a backup chip to keep the motor operating.

* * * * *